(12) United States Patent
Hong et al.

(10) Patent No.: US 11,495,736 B2
(45) Date of Patent: Nov. 8, 2022

(54) SEMICONDUCTOR DEVICE INCLUDING BLOCKING LAYER

(71) Applicant: Samsung Electronics Co., Ltd., Suwon-si (KR)

(72) Inventors: Kyungil Hong, Suwon-si (KR); Younghyun Kim, Seoul (KR); Junghwan Park, Seoul (KR); Sechung Oh, Yongin-si (KR); Jungmin Lee, Gwangmyeong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 304 days.

(21) Appl. No.: 16/793,336

(22) Filed: Feb. 18, 2020

(65) Prior Publication Data
US 2021/0043828 A1  Feb. 11, 2021

(30) Foreign Application Priority Data
Aug. 9, 2019 (KR) .................. 10-2019-0097396

(51) Int. Cl.
| | | |
|---|---|---|
| *H01L 43/02* | (2006.01) | |
| *H01L 27/22* | (2006.01) | |
| *H01L 43/12* | (2006.01) | |
| *H01L 27/1159* | (2017.01) | |
| *H01L 43/08* | (2006.01) | |
| *H01L 27/24* | (2006.01) | |

(52) U.S. Cl.
CPC .......... *H01L 43/02* (2013.01); *H01L 27/1159* (2013.01); *H01L 27/226* (2013.01); *H01L 27/2463* (2013.01); *H01L 43/08* (2013.01); *H01L 43/12* (2013.01)

(58) Field of Classification Search
CPC ... H01L 43/02; H01L 27/1159; H01L 27/226; H01L 27/2463; H01L 43/08; H01L 43/12
USPC .......................................................... 257/421
See application file for complete search history.

(56) References Cited

U.S. PATENT DOCUMENTS

| | | | |
|---|---|---|---|
| 7,342,169 B2* | 3/2008 | Venkatasubramanian | ................... H01L 35/16 257/190 |
| 8,455,985 B2 | 6/2013 | Han et al. | |
| 8,492,808 B2* | 7/2013 | Omori | ............... H01L 23/53238 438/653 |
| 9,269,614 B2 | 2/2016 | Shih et al. | |
| 10,269,700 B2* | 4/2019 | Chiu | ................. H01L 23/53204 |
| 2005/0153373 A1* | 7/2005 | Billing-Medel | ... C07K 14/4748 435/7.23 |
| 2016/0293837 A1 | 10/2016 | Xiao | |
| 2018/0358545 A1 | 12/2018 | Sundar et al. | |
| 2019/0058007 A1 | 2/2019 | Tsai et al. | |

(Continued)

*Primary Examiner* — Jami Valentine Miller
(74) *Attorney, Agent, or Firm* — Harness, Dickey & Pierce, P.L.C.

(57) ABSTRACT

A semiconductor device includes a plurality of magnetic tunnel junction (MTJ) structures in an interlayer insulating layer on a substrate. A blocking layer is on the interlayer insulating layer and the plurality of MTJ structures. An upper insulating layer is on the blocking layer. An upper interconnection is on the upper insulating layer. An upper plug is connected to the upper interconnection and a corresponding one of the plurality of MTJ structures and extends into the upper insulating layer and the blocking layer. The blocking layer includes a material having a higher absorbance constant than the upper insulating layer.

20 Claims, 14 Drawing Sheets

(56) References Cited

U.S. PATENT DOCUMENTS

| | | |
|---|---|---|
| 2019/0067090 A1 | 2/2019 | Chen et al. |
| 2019/0096753 A1 | 3/2019 | Lin et al. |
| 2019/0148633 A1 | 5/2019 | Dai et al. |
| 2019/0157544 A1* | 5/2019 | Hsu ........................ H01L 43/02 |

* cited by examiner

SEMICONDUCTOR DEVICE INCLUDING BLOCKING LAYER

CROSS-REFERENCE TO RELATED APPLICATION

This U.S. non-provisional patent application claims priority under 35 U.S.C. § 119 to and the benefit of Korean Patent Application No. 10-2019-0097396, filed on Aug. 9, 2019, in the Korean Intellectual Property Office (KIPO), the disclosure of which is incorporated herein by reference in its entirety.

BACKGROUND

Field

Devices and methods consistent with example embodiments relate to a semiconductor device including a blocking layer and a method of forming the same.

Description of Related Art

Research has been conducted into semiconductor devices including an upper insulating layer and upper interconnections that are on a magnetic tunnel junction (MTJ) structure. A process of forming the upper interconnections may include a plurality of plasma etching processes. The MTJ structure may be damaged during the process of forming the upper interconnections.

SUMMARY

The example embodiments of the inventive concepts are directed to providing a semiconductor device which is advantageous for an increase in mass production efficiency and has excellent electrical properties, and a method of forming the semiconductor device.

According to example embodiments, there is provided a semiconductor device including a plurality of magnetic tunnel junction (MTJ) structures in an interlayer insulating layer on a substrate. A blocking layer is on the interlayer insulating layer and the plurality of MTJ structures. An upper insulating layer is on the blocking layer, the blocking layer comprising a material having a higher absorbance constant than the upper insulating layer. An upper interconnection is on the upper insulating layer; and an upper plug is connected to the upper interconnection and an MTJ of the plurality of MTJ structures and extending into the upper insulating layer and the blocking layer.

According to example embodiments, there is provided a semiconductor device including a logic circuit region on a substrate. A variable resistance region is on the logic circuit region, the variable resistance region comprising a plurality of variable resistance elements in an interlayer insulating layer. An interconnection region is on the variable resistance region. The inter connection region comprising a first upper insulating layer on a first blocking layer and the first blocking layer on a first etch stop layer. The first blocking layer comprising a material having a higher absorbance constant than the first upper insulating layer and the first etch stop layer. A first upper interconnection is on the first upper insulating layer, and a first upper plug is connected to the first upper interconnection and a corresponding one of the plurality of variable resistance elements and extending into the first upper insulating layer, the first blocking layer, and the first etch stop layer.

According to example embodiments, there is provided a semiconductor device including a plurality of MTJ structures in an interlayer insulating layer on a substrate. An etch stop layer is on the interlayer insulating layer and the plurality of MTJ structures. At least one blocking layer is on the etch stop layer, and includes a non-magnetic metal layer. A first upper insulating layer is on the at least one blocking layer. An upper interconnection is on the first upper insulating layer. An upper plug is connected to the upper interconnection and a corresponding one of the plurality of MTJ structures and extends into the first upper insulating layer, the at least one blocking layer, and the etch stop layer.

DETAILED DESCRIPTION OF EXEMPLARY EMBODIMENTS

Although the terms "first," "second," "third," etc., may be used herein to describe various elements, components, and/or layers, these elements, components, and/or layers, should not be limited by these terms. These terms are only used to distinguish one element, component, and/or layer from another element, component, and/or layer. Thus, a first element, component, or layer, discussed below may be termed a second element, component, or layer, without departing from the scope of this disclosure.

Similarly, spatially relative terms, such as "lower," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

FIGS. 1 to 8 are cross-sectional views illustrating semiconductor devices according to embodiments of the inventive concepts.

"When the term "substantially" is used in this specification in connection with a numerical value, it is intended that the associated numerical value include a tolerance of ±10% around the stated numerical value. When ranges are specified, the range includes all values therebetween such as increments of 0.1%."

Figure 1:
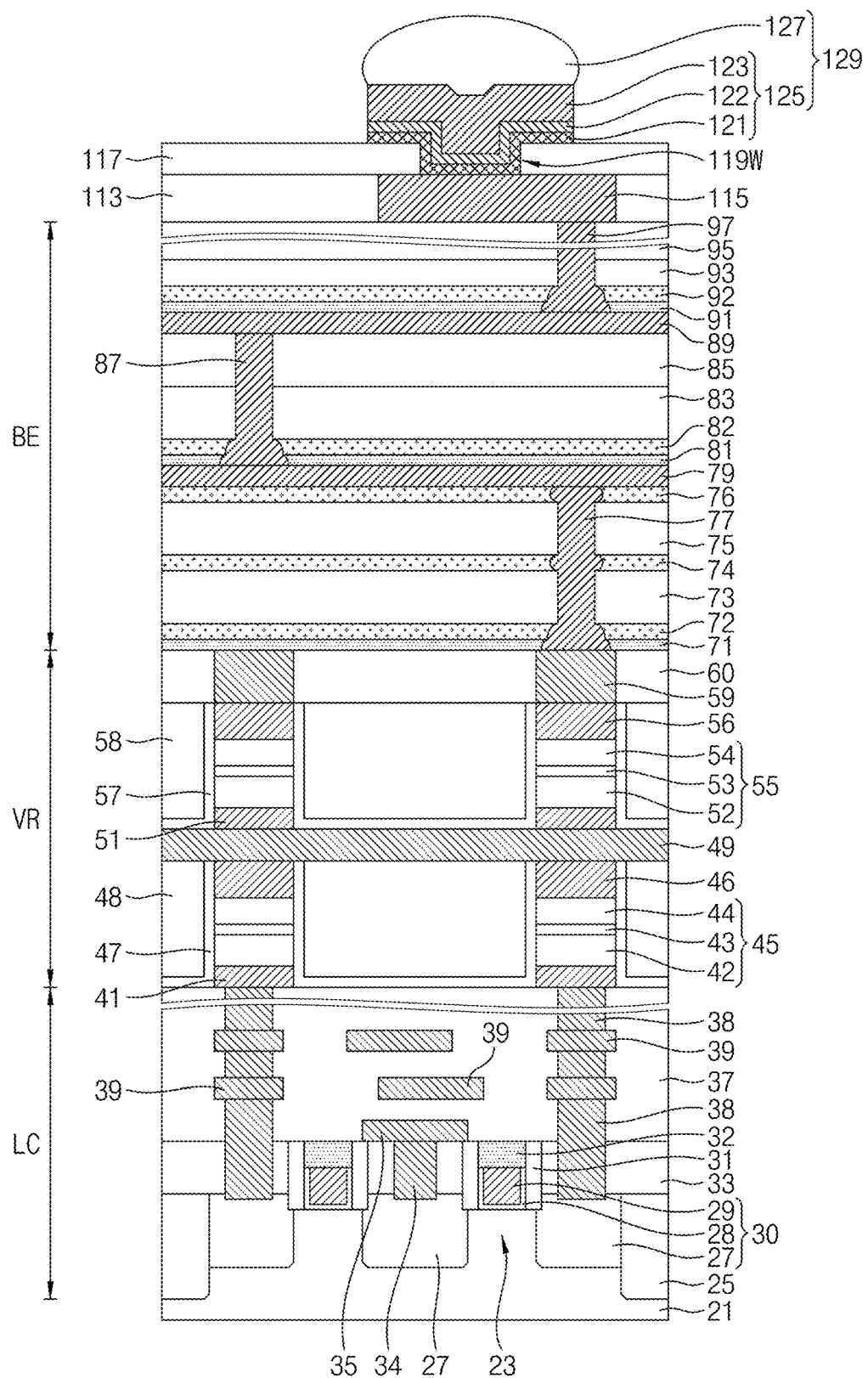
FIGS. 1 to 8 are cross-sectional views illustrating semiconductor devices according to embodiments of the inventive concepts.

Referring to FIG. 1, a semiconductor device according to an embodiment of the inventive concepts may include a logic circuit region LC on a substrate 21. The logic circuit region LC may include various kinds of logic circuits such as switching elements, a memory controller, an application processor, a microprocessor, or a combination thereof.

In an embodiment, the logic circuit region LC may include a plurality of active regions 23, a device isolation layer 25, a plurality of source/drain regions 27, a gate dielectric layer 28, a plurality of gate electrodes 29, a plurality of gate spacers 31, a plurality of gate capping layers 32, a first lower insulating layer 33, a source plug 34, a source line 35, a second lower insulating layer 37, a plurality of lower plugs 38, and a plurality of lower interconnections 39. The plurality of source/drain regions 27, gate dielectric layers 28, and gate electrodes 29 may constitute a plurality of transistors 30. Each of the plurality of transistors 30 may include a fin field-effect transistor (finFET), a multi-bridge channel (MBC) transistor, a nanowire transistor, a vertical transistor, a recess channel transistor, a three-dimensional (3D) transistor, a planar transistor, or a combination thereof.

The substrate 21 may include a semiconductor substrate such as a silicon wafer or a silicon-on insulator (SOI) wafer. The plurality of transistors 30 may be in the substrate 21 and/or on the substrate 21. For example, some of the plurality of transistors 30 may be in the substrate 21 and with the remaining transistors on the substrate 21, all of the plurality of transistors 30 may be on the substrate 21, or all of the plurality of transistors 30 may be in the substrate 21. Some of the plurality of transistors 30 may serve as switching elements. The active region 23 may be defined in the substrate 21 by the device isolation layer 25. The plurality of gate electrodes 29 may be on the active region 23. A gate dielectric layer 28 may be between the plurality of gate electrodes 29 and the active region 23. The plurality of source/drain regions 27 may be formed in the active region 23 adjacent to the plurality of gate electrodes 29. The plurality of gate spacers 31 may be on sidewalls of the plurality of gate electrodes 29. The plurality of gate capping layers 32 may be on the plurality of gate electrodes 29.

The first lower insulating layer 33 may be on the plurality of source/drain regions 27 and the device isolation layer 25. The source line 35 may be on the first lower insulating layer 33. The source plug 34 may be in the first lower insulating layer 33. The source plug 34 may pass through the first lower insulating layer 33 and be in contact with a corresponding one of the plurality of source/drain regions 27. The second lower insulating layer 37 may be on the first lower insulating layer 33. The plurality of lower plugs 38 and the plurality of lower interconnections 39 may be in the first lower insulating layer 33 and the second lower insulating layer 37. Some of the plurality of lower plugs 38 and the plurality of lower interconnections 39 may be electrically connected to a corresponding one of the plurality of source/drain regions 27.

Each of the plurality of gate electrodes 29, the source plug 34, the source line 35, the plurality of lower plugs 38, and the plurality of lower interconnections 39 may be a conductive material, and may be a metal like aluminum (Al), copper (Cu), nickel (Ni), cobalt (Co), silver (Ag), platinum (Pt), ruthenium (Ru), tungsten (W), tantalum (Ta), and/or titanium (Ti), a conductive ceramic (e.g., a metal nitride like titanium nitride (TiN), zirconium nitride (ZrN), hafnium nitride (HfN), vanadium nitride (VN), niobium nitride (NbN), tantalum nitride (TaN), MoN, and/or tungsten nitride (WN), a metal oxide like zirconium oxide (ZnO), indium oxide ($In_2O_3$), fluorine doped tin oxide (FTO), indium tin oxide (ITO), and/or aluminum doped zinc oxide (AZO), and/or a metal silicide like nickel silicide (NiSi), magnesium silicide ($Mg_2Si$), molybdenum disilicide ($MoSi_2$) and/or tungsten disilicide ($WSi_2$)), polysilicon, a conductive carbon, or a combination thereof. The gate dielectric layer 28 may be an insulator. For example, the gate dielectric layer 28 may be silicon oxide, silicon nitride, silicon oxynitride, a high-k dielectric material like hafnium silicate ($HfSiO_4$), zirconium silicate ($ZrSiO_4$), hafnium oxide ($HfO_2$), and/or zirconium oxide ($ZrO_2$), or a combination thereof. The plurality of gate spacers 31 may be an insulator like silicon oxide, silicon nitride, silicon oxynitride, or a combination thereof. The plurality of gate capping layers 32 may include silicon nitride. Each of the device isolation layer 25, the first lower insulating layer 33, and the second lower insulating layer 37 may be an insulator and may be silicon oxide, silicon nitride, silicon oxynitride, a low-k dielectric, or a combination thereof.

A variable resistance region VR may be on the logic circuit region LC. The variable resistance region VR may include a plurality of variable resistance elements 45 and 55 which are in a plurality of interlayer insulating layers 48 and 58. The plurality of variable resistance elements 45 and 55 may include a magnetoresistive random access memory (MRAM), a resistive RAM (RRAM), a ferroelectric RAM (FeRAM), or a combination thereof. In an embodiment, the variable resistance region VR may include a plurality of first lower electrodes 41, a plurality of first variable resistance elements 45, a plurality of first upper electrodes 46, first memory spacers 47, a first interlayer insulating layer 48, a first middle interconnection 49, a plurality of second lower electrodes 51, a plurality of second variable resistance elements 55, a plurality of second upper electrodes 56, second memory spacers 57, a second interlayer insulating layer 58, a plurality of second middle interconnections 59, and a third interlayer insulating layer 60.

The semiconductor device may include a non-volatile memory device such as an MRAM or a cross-point (X-point) memory. The semiconductor device may include an embedded MRAM (eMRAM). In an embodiment, each of the plurality of first variable resistance elements 45 and the plurality of second variable resistance elements 55 may include a magnetic tunnel junction (MTJ) structure. Each of the plurality of first variable resistance elements 45 and the plurality of second variable resistance elements 55 may include an in-plane MTJ (TMTJ) or a perpendicular MTJ (pMTJ). For example, each of the plurality of first variable resistance elements 45 may include a first reference layer 42, a first tunnel layer 43, and a first storage layer 44. Each of the plurality of second variable resistance elements 55 may include a second reference layer 52, a second tunnel layer 53, and a second storage layer 54.

The plurality of first lower electrodes 41, the plurality of first variable resistance elements 45, the plurality of first upper electrodes 46, and the first memory spacer 47 may be in the first interlayer insulating layer 48. The plurality of first variable resistance elements 45 may be between the plurality of first lower electrodes 41 and the plurality of first upper electrodes 46. The first memory spacers 47 may be on side surfaces of the plurality of first lower electrodes 41, the plurality of first variable resistance elements 45, and the plurality of first upper electrodes 46.

Each of the plurality of first lower electrodes 41 may be connected to the plurality of source/drain regions 27 via the plurality of lower plugs 38 and/or the plurality of lower interconnections 39. Each of the plurality of first variable resistance elements 45 may be connected to the plurality of transistors 30 via the plurality of first lower electrodes 41, the plurality of lower plugs 38, and/or the plurality of lower interconnections 39. Each of the plurality of first variable resistance elements 45 may include the first reference layer 42, the first storage layer 44 on the first reference layer 42, and the first tunnel layer 43 between the first reference layer 42 and the first storage layer 44.

The first middle interconnection 49 may be on the first interlayer insulating layer 48 and connected to the plurality of first upper electrodes 46. The second interlayer insulating layer 58 may cover the first interlayer insulating layer 48 and the first middle interconnection 49.

The plurality of second lower electrodes 51, the plurality of second variable resistance elements 55, the plurality of second upper electrodes 56, and the second memory spacers 57 may be in the second interlayer insulating layer 58. The plurality of second variable resistance elements 55 may be between the plurality of second lower electrodes 51 and the plurality of second upper electrodes 56. The second memory spacers 57 may be on side surfaces of the plurality of second lower electrodes 51, the plurality of second variable resistance elements 55, and the plurality of second upper electrodes 56. The plurality of second lower electrodes 51 may be connected to the first middle interconnection 49. Each of the plurality of second variable resistance elements 55 may include the second reference layer 52, the second storage layer 54 on the second reference layer 52, and the second tunnel layer 53 between the second reference layer 52 and the second storage layer 54.

The third interlayer insulating layer 60 may be on the second interlayer insulating layer 58. The plurality of second middle interconnections 59 may be in the third interlayer insulating layer 60 and connected to the plurality of second upper electrodes 56.

Each of the plurality of first lower electrodes 41, the plurality of first upper electrodes 46, the first middle interconnection 49, the plurality of second lower electrodes 51, the plurality of second upper electrodes 56, and the plurality of second middle interconnections 59 may include a conductive material like a metal, a metal nitride, a metal oxide, a metal silicide, polysilicon, a conductive carbon, or a combination thereof. The conductive materials of the plurality of first lower electrodes 41, the plurality of first upper electrodes 46, the first middle interconnection 49, the plurality of second lower electrodes 51, the plurality of second upper electrodes 56, and the plurality of second middle interconnections 59 may be the same or different materials to the lower interconnections 39. Each of the first reference layer 42 and the second reference layer 52 may include a pinned layer, a fixed layer, or a combination thereof. Each of the first reference layer 42 and the second reference layer 52 may include a ferromagnetic material. Each of the first reference layer 42 and the second reference layer 52 may include a synthetic antiferromagnetic (SAF) structure. The SAF structure may include two magnetic layers and a spacer layer interposed between the two magnetic layers. For example, the SAF structure may include a cobalt/iron/boron (CoFeB) layer, a ruthenium (Ru) layer, and a cobalt iron (CoFe) layer which are sequentially stacked.

Each of the first storage layer 44 and the second storage layer 54 may include a free layer. Each of the first storage layer 44 and the second storage layer 54 may include CoFe, CoFeB, or a combination thereof. Each of the first storage layer 44 and the second storage layer 54 may include an SAF structure. Each of the first tunnel layer 43 and the second tunnel layer 53 may correspond to a tunnel barrier layer. Each of the first tunnel layer 43 and the second tunnel layer 53 may include a metal oxide such as magnesium oxide (MgO), ruthenium oxide (RuO), vanadium oxide (VO), tungsten oxide (WO), tantalum oxide (TaO), hafnium oxide (HfO), molybdenum oxide (MoO), or a combination thereof. For example, each of the first tunnel layer 43 and the second tunnel layer 53 may be a MgO layer.

Each of the first memory spacers 47 and the second memory spacers 57 may include a material having a higher absorbance constant K than the first interlayer insulating layer 48, the second interlayer insulating layer 58, and the third interlayer insulating layer 60. The absorbance constant K may be the thermal conductivity coefficient of the material. The absorbance constant K may also be the optical absorbance coefficient of the material for a wavelength of light, for example ultraviolet (UV).

Each of the first interlayer insulating layer 48, the second interlayer insulating layer 58, and the third interlayer insulating layer 60 may include silicon oxide, silicon nitride, silicon oxynitride, a low-k dielectric, or a combination thereof.

An interconnection region BE may be on the variable resistance region VR. In an embodiment, the interconnection region BE may include a first etch stop layer 71, a first blocking layer 72, a first upper insulating layer 73, a second blocking layer 74, a second upper insulating layer 75, a third blocking layer 76, a first upper plug 77, a first upper interconnection 79, a second etch stop layer 81, a fourth blocking layer 82, a third upper insulating layer 83, a fourth upper insulating layer 85, a second upper plug 87, a second upper interconnection 89, a third etch stop layer 91, a fifth blocking layer 92, a fifth upper insulating layer 93, a sixth upper insulating layer 95, and a third upper plug 97.

The first etch stop layer 71 may cover the third interlayer insulating layer 60 and the plurality of second middle interconnections 59. The first blocking layer 72, the first upper insulating layer 73, the second blocking layer 74, the second upper insulating layer 75, and the third blocking layer 76 may be sequentially stacked on the first etch stop layer 71. The first upper plug 77 may be in the first etch stop layer 71, the first blocking layer 72, the first upper insulating layer 73, the second blocking layer 74, the second upper insulating layer 75, and the third blocking layer 76. The first upper interconnection 79 may be on the third blocking layer 76. The first upper plug 77 may pass through the first etch stop layer 71, the first blocking layer 72, the first upper insulating layer 73, the second blocking layer 74, the second upper insulating layer 75, and the third blocking layer 76 and be in contact with the first upper interconnection 79 and a corresponding one of the plurality of second middle interconnections 59.

Each of the first upper plug 77 and the first upper interconnection 79 may include a conductive material like a metal, a metal nitride, a metal oxide, a metal silicide, polysilicon, a conductive carbon, or a combination thereof. Each of the first upper insulating layer 73 and the second upper insulating layer 75 may include an insulator like silicon oxide, silicon nitride, silicon oxynitride, a low-k dielectric or a combination thereof. In an embodiment, the first upper insulating layer 73 may include a silicon oxide layer formed using tetraethylorthosilicate (TEOS). The second upper insulating layer 75 may include a material layer that is relatively more flowable than the first upper insulating layer 73. The second upper insulating layer 75 may include a silicon oxide layer formed using flowable TEOS (FTEOS).

The first etch stop layer 71 may include a material having an etch selectivity with respect to the first upper insulating layer 73, the second upper insulating layer 75, the first blocking layer 72, the second blocking layer 74, and the third blocking layer 76. In an embodiment, the first etch stop layer 71 may include silicon carbonitride (SiCN).

Each of the first blocking layer 72, the second blocking layer 74, and the third blocking layer 76 may include a material having a higher absorbance constant K than the first etch stop layer 71, the first upper insulating layer 73, and the second upper insulating layer 75. Each of the first blocking layer 72, the second blocking layer 74, and the third blocking layer 76 may include silicon oxynitride (SiON). Each of the first blocking layer 72, the second blocking layer 74, and the third blocking layer 76 may include a silicon oxynitride layer formed at a process temperature of 250° C. to 350° C. Each of the first blocking layer 72, the second blocking layer 74, and the third blocking layer 76 may be thicker than the first etch stop layer 71. Each of the first blocking layer 72, the second blocking layer 74, and the third blocking layer 76 may have a thickness of 10 nm to 100 nm.

In an embodiment, each of the first memory spacers 47 and the second memory spacers 57 may include a material having a higher absorbance constant K than the first etch stop layer 71, the first upper insulating layer 73, and the second upper insulating layer 75. Each of the first memory spacers 47 and the second memory spacers 57 may include silicon oxynitride.

The second etch stop layer 81, the fourth blocking layer 82, the third upper insulating layer 83, and the fourth upper insulating layer 85 may be sequentially stacked on the third blocking layer 76 and the first upper interconnection 79. The second upper plug 87 may be in the second etch stop layer 81, the fourth blocking layer 82, the third upper insulating layer 83, and the fourth upper insulating layer 85. The second upper interconnection 89 may be on the fourth upper insulating layer 85. The second upper plug 87 may pass through the second etch stop layer 81, the fourth blocking layer 82, the third upper insulating layer 83, and the fourth upper insulating layer 85 and be in contact with the first upper interconnection 79 and the second upper interconnection 89.

The third etch stop layer 91, the fifth blocking layer 92, the fifth upper insulating layer 93, and the sixth upper insulating layer 95 may be sequentially stacked on the fourth upper insulating layer 85 and the second upper interconnection 89. The third upper plug 97 may be in the third etch stop layer 91, the fifth blocking layer 92, the fifth upper insulating layer 93, and the sixth upper insulating layer 95. The third upper plug 97 may pass through the third etch stop layer 91, the fifth blocking layer 92, the fifth upper insulating layer 93, and the sixth upper insulating layer 95 and be in contact with the second upper interconnection 89.

Each of the second upper plug 87, the second upper interconnection 89, and the third upper plug 97 may a conductor like a metal, a metal nitride, a metal oxide, a metal silicide, polysilicon, a conductive carbon, or a combination thereof. Each of the third upper insulating layer 83 and the fifth upper insulating layer 93 may include a configuration similar to that of the first upper insulating layer 73. Each of the third upper insulating layer 83 and the fifth upper insulating layer 93 may include a silicon oxide layer formed using TEOS.

Each of the fourth upper insulating layer 85 and the sixth upper insulating layer 95 may include a configuration similar to that of the second upper insulating layer 75. For example, each of the fourth upper insulating layer 85 and the sixth upper insulating layer 95 may include a silicon oxide layer formed using FTEOS.

Each of the second etch stop layer 81 and the third etch stop layer 91 may include a configuration similar to that of the first etch stop layer 71. For example, each of the second etch stop layer 81 and the third etch stop layer 91 may include silicon carbonitride. Each of the fourth blocking layer 82 and the fifth blocking layer 92 may include a configuration similar to those of the first blocking layer 72, the second blocking layer 74, and the third blocking layer 76. For example, each of the fourth blocking layer 82 and the fifth blocking layer 92 may include a material having a higher absorbance constant K than the second etch stop layer 81, the third upper insulating layer 83, the fourth upper insulating layer 85, the third etch stop layer 91, the fifth upper insulating layer 93, and the sixth upper insulating layer 95. Each of the fourth blocking layer 82 and the fifth blocking layer 92 may include silicon oxynitride.

A first passivation layer 113, an I/O terminal 115, a second passivation layer 117, an opening 119W, and a bump 129 may be on the interconnection region BE. The bump 129 may include a pillar structure 125 and a solder 127 on the pillar structure 125. The pillar structure 125 may include a barrier layer 121, a seed layer 122, and a pillar 123. The I/O terminal 115 may include a bump pad, a bonding pad, or a bond finger.

The first passivation layer 113 may cover the sixth upper insulating layer 95. The first passivation layer 113 may include silicon oxide, silicon nitride, silicon oxynitride, a low-k dielectric, or a combination thereof. The first passivation layer 113 may include a silicon oxide layer formed using TEOS.

The I/O terminal 115 may be in the first passivation layer 113. The I/O terminal 115 may be in contact with the third upper plug 97. The I/O terminal 115 may be connected to a corresponding one of the plurality of second middle interconnections 59 via the third upper plug 97, the second upper interconnection 89, the second upper plug 87, the first upper interconnection 79, and the first upper plug 77. The I/O terminal 115 may be electrically connected to at least a corresponding one of the plurality of first variable resistance elements 45 and the plurality of second variable resistance elements 55. The I/O terminal 115 may be a conductor like a metal, a metal nitride, a metal silicide, a metal oxide, a conductive carbon, or a combination thereof. For example, the I/O terminal 115 may include aluminum (Al), copper (Cu), nickel (Ni), cobalt (Co), silver (Ag), platinum (Pt), ruthenium (Ru), tungsten (W), tungsten nitride (WN), titanium (Ti), titanium nitride (TiN), tantalum (Ta), tantalum nitride (TaN), or a combination thereof.

The second passivation layer 117 may cover the I/O terminal 115 and the first passivation layer 113. The second passivation layer 117 may be an insulator like silicon oxide, silicon nitride, silicon oxynitride, a low-k dielectric, photosensitive polyimide (PSPI), or a combination thereof. The opening 119W may pass through the second passivation layer 117. The bump 129 may be on the second passivation layer 117. The bump 129 may extend into the second passivation layer 117 through the opening 119W and be in contact with an upper surface of the I/O terminal 115.

The barrier layer 121 may include Ti, TiN, Ta, TaN, or a combination thereof. The seed layer 122 may include copper (Cu). The pillar 123 may include a conductive material, like nickel (Ni), copper (Cu), aluminum (Al), silver (Ag), platinum (Pt), ruthenium (Ru), tin (Sn), gold (Au), tungsten (W), tungsten nitride (WN), titanium (Ti), titanium nitride (TiN), tantalum (Ta), tantalum nitride (TaN), or a combination thereof. The solder 127 may include Sn, Ag, Cu, Ni, Au, or a combination thereof. For example, the solder 127 may be a layer of eutectic alloy like Sn—Ag—Cu.

The formation of the first upper plug 77, the first upper interconnection 79, the second upper plug 87, the second upper interconnection 89, the third upper plug 97, and the I/O terminal 115 may include a plurality of patterning processes. The plurality of patterning processes may include an etching process using plasma. The first blocking layer 72, the second blocking layer 74, the third blocking layer 76, the fourth blocking layer 82, and the fifth blocking layer 92 may prevent damage to the plurality of first variable resistance elements 45 and the plurality of second variable resistance elements 55 during the plurality of patterning processes.

Figure 2:
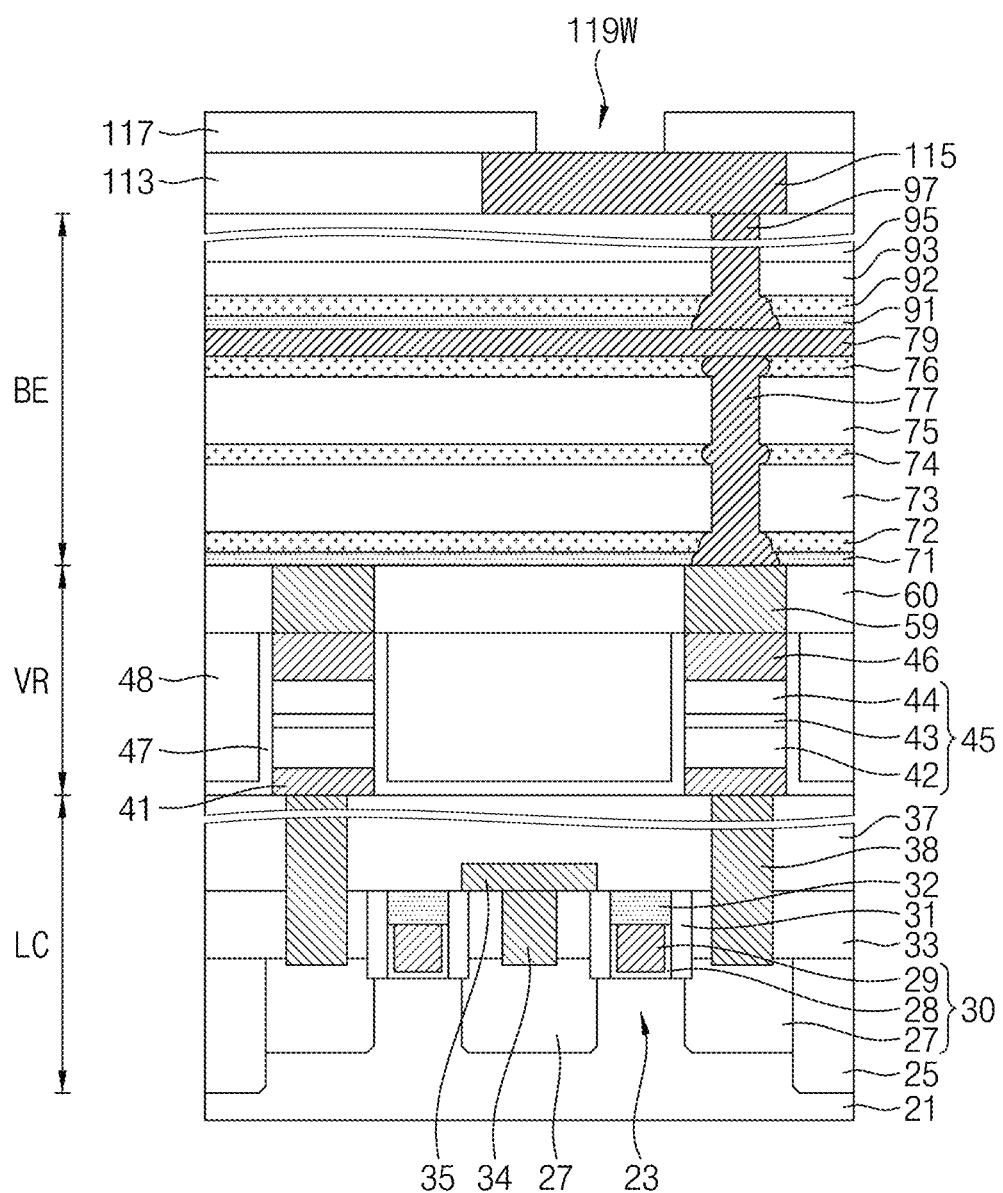

Referring to FIG. 2, a semiconductor device according to an embodiment of the inventive concepts may include a substrate 21, an active region 23, a device isolation layer 25, a plurality of source/drain regions 27, a gate dielectric layer 28, a plurality of gate electrodes 29, a plurality of gate spacers 31, a plurality of gate capping layers 32, a first lower insulating layer 33, a source plug 34, a source line 35, a second lower insulating layer 37, a plurality of lower plugs 38, a plurality of first lower electrodes 41, a plurality of first variable resistance elements 45, a plurality of first upper electrodes 46, first memory spacers 47, a first interlayer insulating layer 48, a plurality of second middle interconnections 59, a third interlayer insulating layer 60, a first etch stop layer 71, a first blocking layer 72, a first upper insulating layer 73, a second blocking layer 74, a second upper insulating layer 75, a third blocking layer 76, a first upper plug 77, a first upper interconnection 79, a third etch stop layer 91, a fifth blocking layer 92, a fifth upper insulating layer 93, a sixth upper insulating layer 95, a third upper plug 97, a first passivation layer 113, an I/O terminal 115, a second passivation layer 117, and an opening 119W. Like reference numerals designate like elements and a detailed description thereof will not be repeated.

The plurality of first variable resistance elements 45 may be connected to the plurality of transistors 30 via the plurality of first lower electrodes 41 and the plurality of lower plugs 38. Each of the plurality of transistors 30 may serve as a switching element. The opening 119W may pass through the second passivation layer 117. An upper surface of the I/O terminal 115 may be partially exposed inside the opening 119W.

A lateral width of the first upper plug 77 adjacent to the first blocking layer 72 may be greater than a lateral width of the first upper plug 77 adjacent to the first upper insulating layer 73. A lateral width of the first upper plug 77 adjacent to the first etch stop layer 71 may be greater than the lateral width of the first upper plug 77 adjacent to the first blocking layer 72. A lateral width of the first upper plug 77 adjacent to the second blocking layer 74 may be greater than a lateral width of the first upper plug 77 adjacent to the second upper insulating layer 75. A lateral width of the first upper plug 77 adjacent to the third blocking layer 76 may be greater than the lateral width of the first upper plug 77 adjacent to the second upper insulating layer 75.

Figure 3:
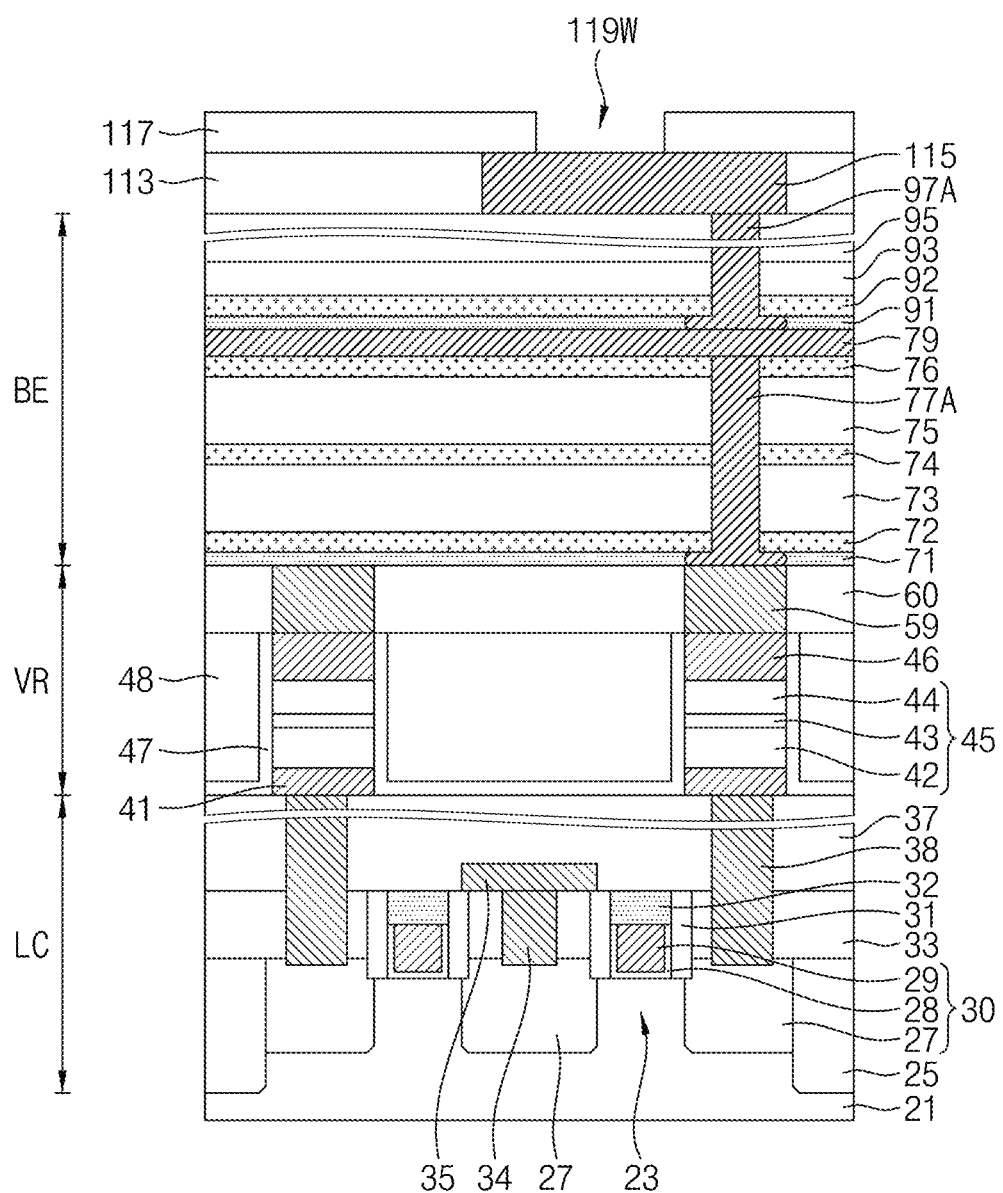

Referring to FIG. 3, a lateral width of a first upper plug 77A adjacent to a first blocking layer 72 may be substantially equal to a lateral width of the first upper plug 77A adjacent to a first upper insulating layer 73. A lateral width of the first upper plug 77A adjacent to the first etch stop layer 71 may be greater than the lateral width of the first upper plug 77A adjacent to the first blocking layer 72. A lateral width of the first upper plug 77A adjacent to a second blocking layer 74 may be substantially equal to a lateral width of the first upper plug 77A adjacent to a second upper insulating layer 75. A lateral width of the first upper plug 77A adjacent to a third blocking layer 76 may be substantially equal to the lateral width of the first upper plug 77 adjacent to the second upper insulating layer 75.

Additionally, the lateral width of the third upper plug 97A adjacent to the fifth blocking layer 92 may be substantially equal to a lateral width of the third upper plug 97 adjacent to the fifth upper insulating layer 93 and to a lateral width of the sixth upper insulating layer 95. A lateral width of the third upper plug 97A adjacent to the third etch stop layer 91 may be greater than the lateral width of the third upper plug 97A adjacent to the fifth blocking layer 92.

Figure 4:
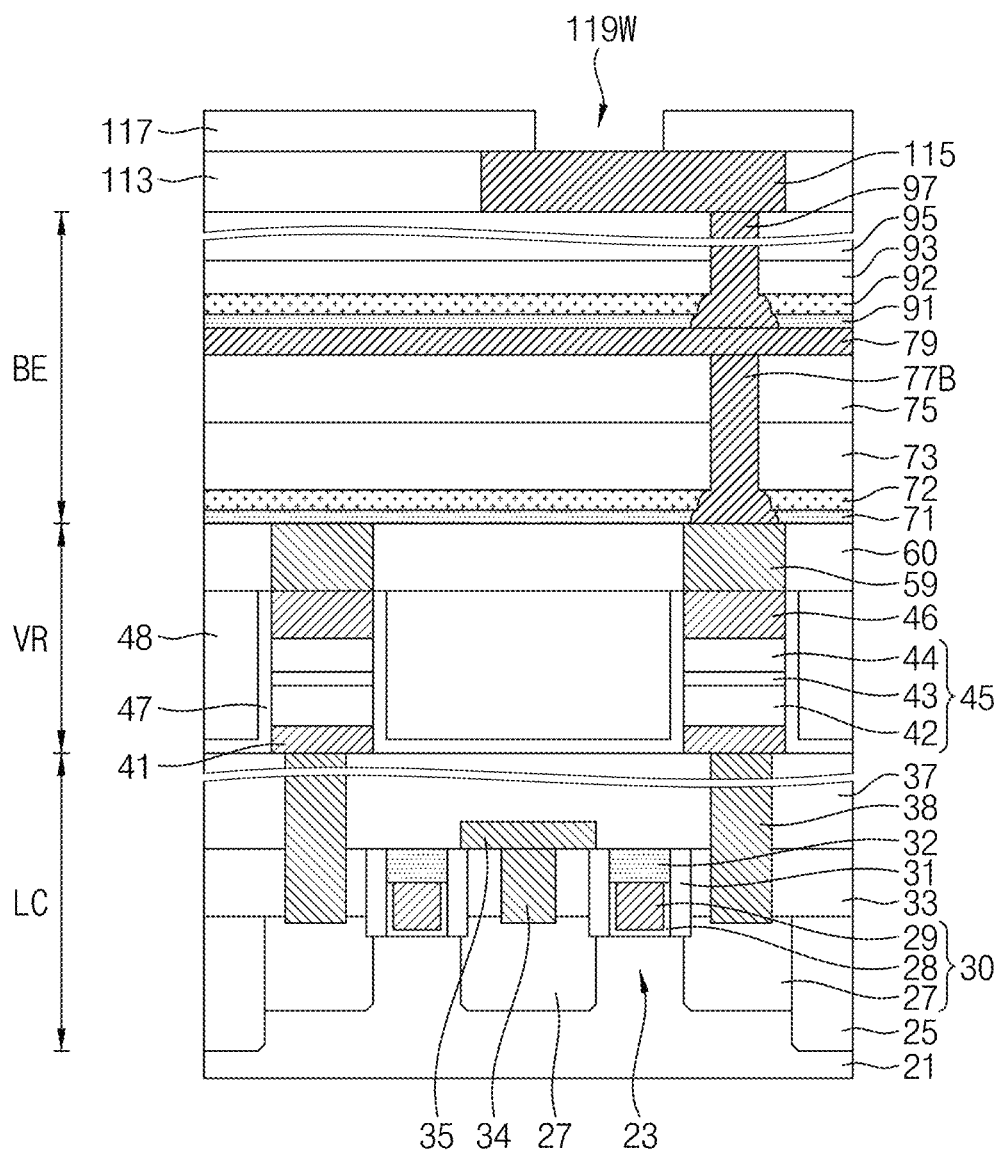

Referring to FIG. 4, a first blocking layer 72, a first upper insulating layer 73, and a second upper insulating layer 75 may be sequentially stacked on a first etch stop layer 71. A first upper interconnection 79 may be on the second upper insulating layer 75. A first upper plug 77B may be to pass through the first etch stop layer 71, the first blocking layer 72, the first upper insulating layer 73, and the second upper insulating layer 75. A lateral width of the first upper plug 77B adjacent to the first etch stop layer 71 may be greater than the lateral width of the first upper plug 77B adjacent to the first blocking layer 72 and the lateral width of the first upper plug 77B adjacent to the second upper insulating layer 75. The lateral width of the first upper plug 77B adjacent to the first blocking layer 72 may also be greater than the lateral width of the first upper plug adjacent to first upper insulating layer 73 and the second upper insulating layer 75.

Figure 5:
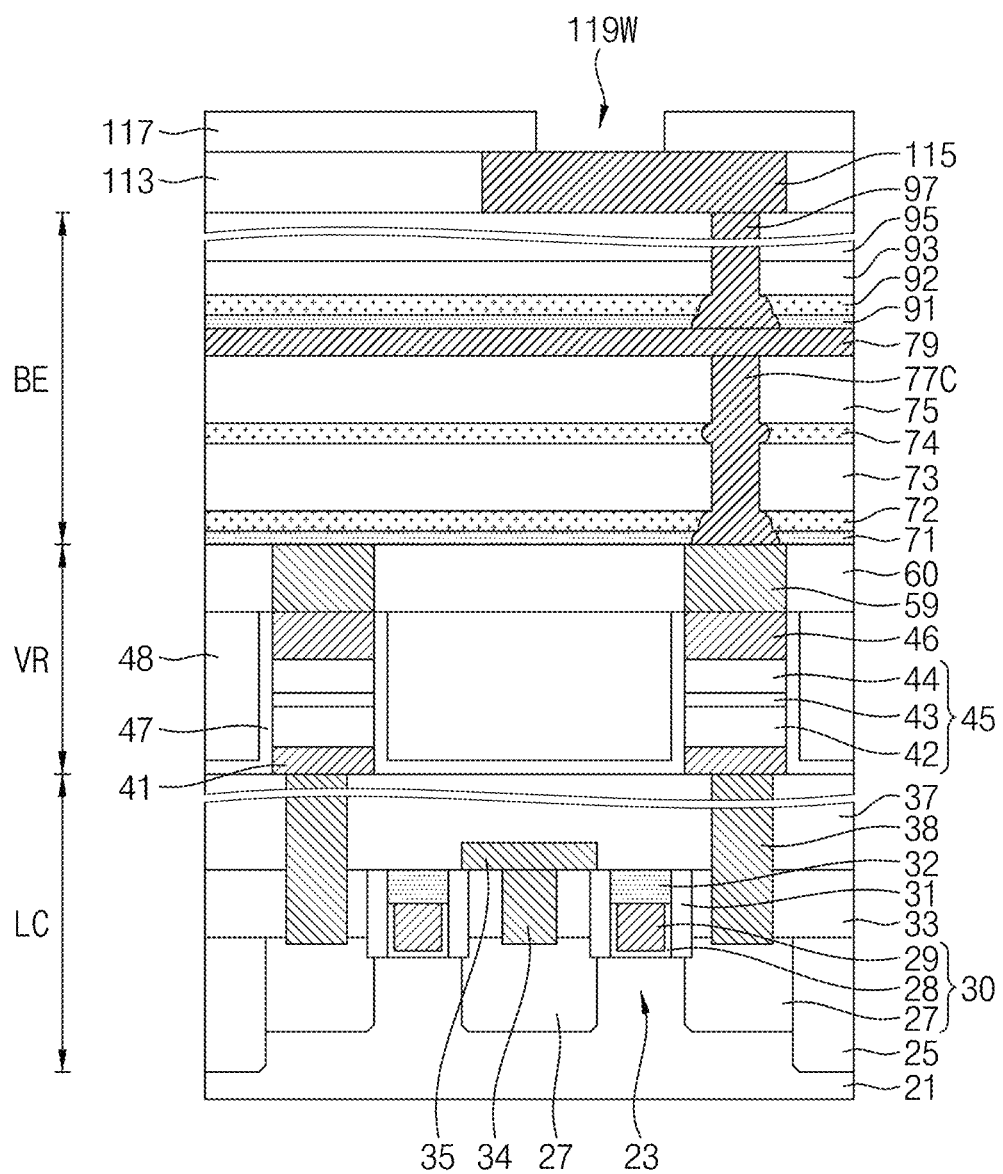

Referring to FIG. 5, a first blocking layer 72, a first upper insulating layer 73, a second blocking layer 74, and a second upper insulating layer 75 may be sequentially stacked on a first etch stop layer 71. A first upper interconnection 79 may be on the second upper insulating layer 75. A first upper plug 77C may be to pass through the first etch stop layer 71, the first blocking layer 72, the first upper insulating layer 73, the second blocking layer 74, and the second upper insulating layer 75. A lateral width of the first upper plug 77C adjacent to the first etch stop layer 71 may be greater than the lateral width of the first upper plug 77C adjacent to the first blocking layer 72 and the lateral width of the first upper plug 77C adjacent to the second upper insulating layer 75. The lateral width of the first upper plug 77C adjacent to the first blocking layer 72 may also be greater than the lateral width of the first upper plug adjacent to first upper insulating layer 73 and the second upper insulating layer 75, and the lateral width of the first upper plug 77C adjacent to the second blocking layer 74 may be also be greater than the lateral width of the first upper plug adjacent to first upper insulating layer 73 and the second upper insulating layer 75.

Figure 6:
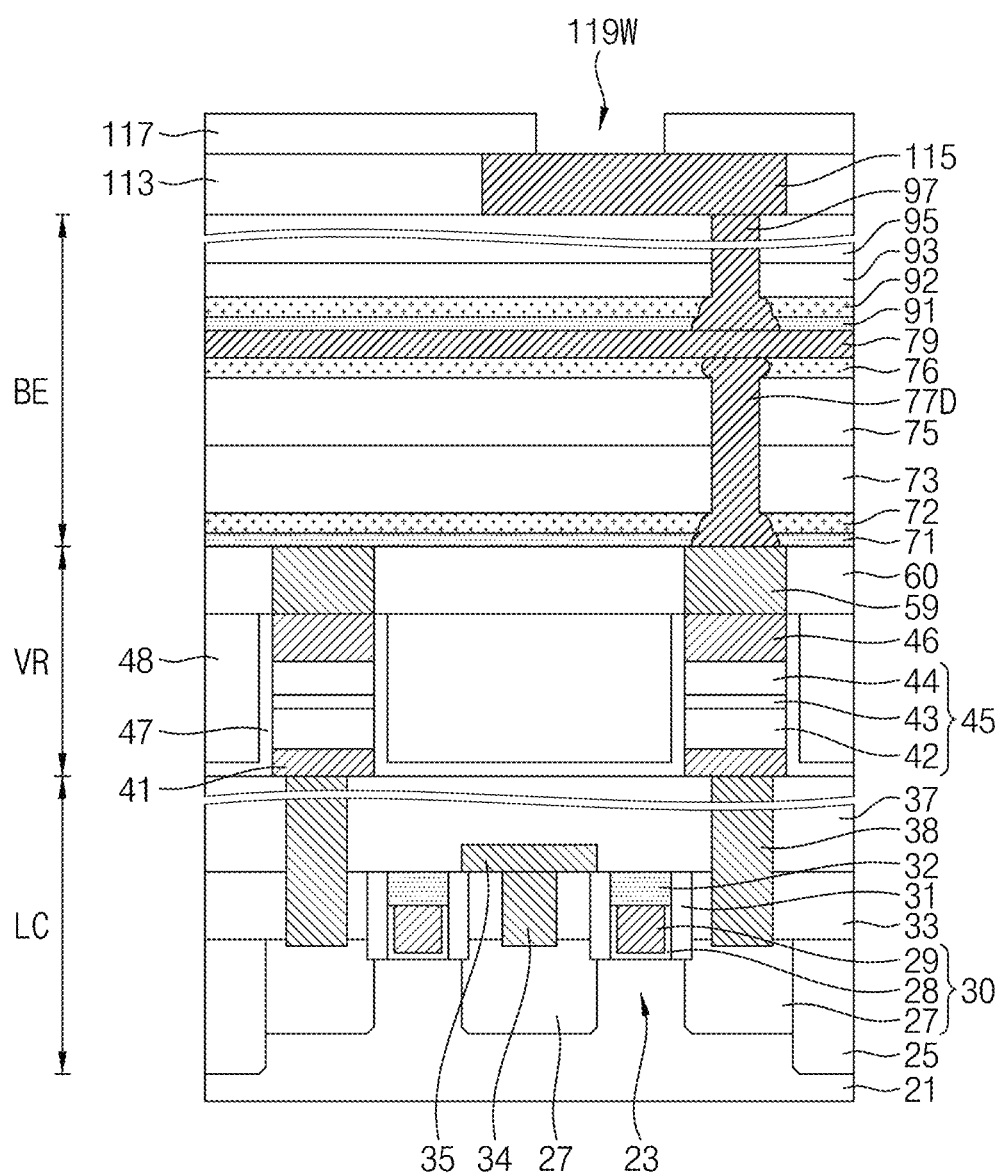

Referring to FIG. 6, a first blocking layer 72, a first upper insulating layer 73, a second upper insulating layer 75, and a third blocking layer 76 may be sequentially stacked on a first etch stop layer 71. A first upper interconnection 79 may be on the third blocking layer 76. A first upper plug 77D may be to pass through the first etch stop layer 71, the first blocking layer 72, the first upper insulating layer 73, the second upper insulating layer 75, and the third blocking layer 76. A lateral width of the first upper plug 77D adjacent to the first etch stop layer 71 may be greater than the lateral width of the first upper plug 77D adjacent to the first blocking layer 72 and the lateral width of the first upper plug 77D adjacent to the second upper insulating layer 75. The lateral width of the first upper plug 77D adjacent to the first blocking layer 72 may also be greater than the lateral width of the first upper plug adjacent to first upper insulating layer 73 and the second upper insulating layer 75, and the lateral width of the first upper plug 77D adjacent to the third blocking layer 76 may be also be greater than the lateral width of the first upper plug adjacent to first upper insulating layer 73 and the second upper insulating layer 75.

Figure 7:
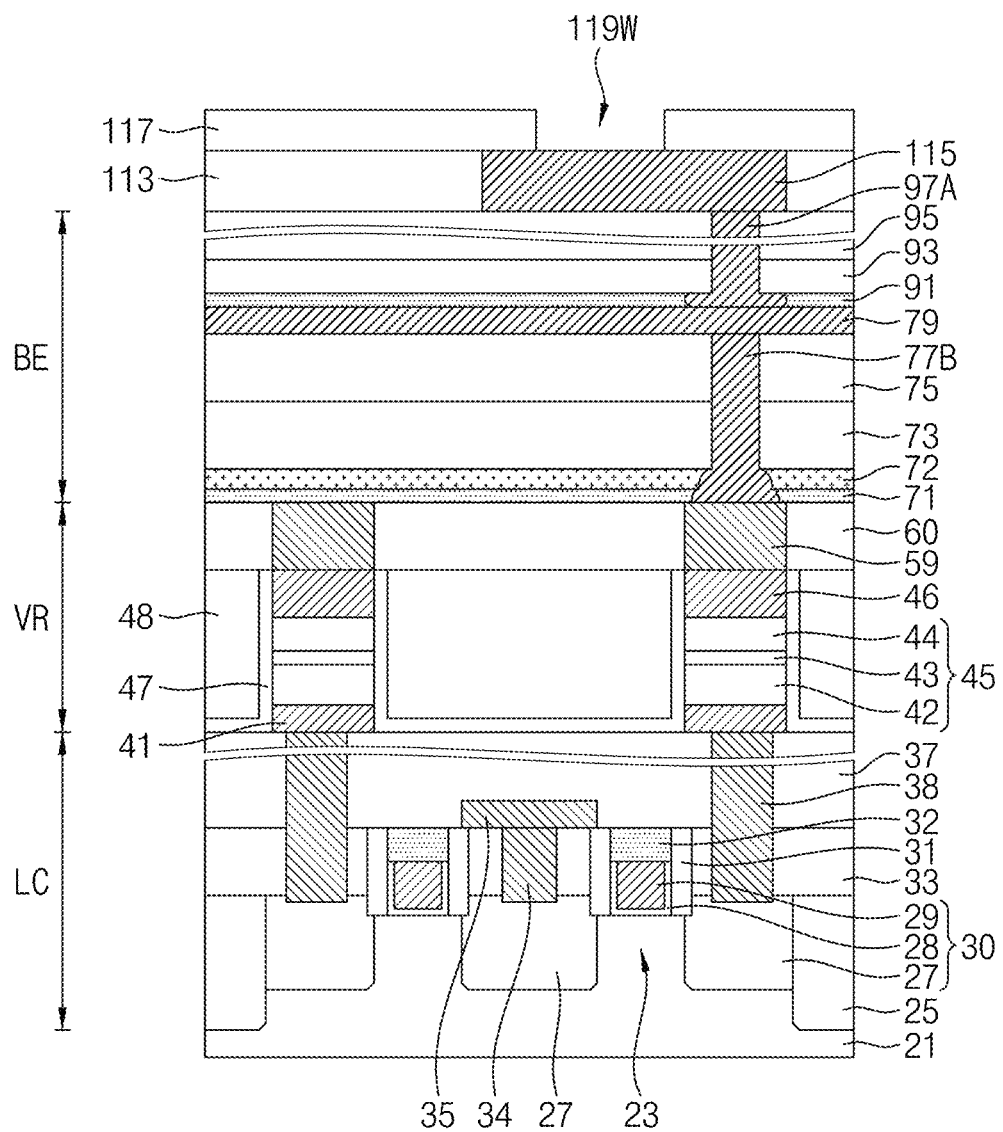

Referring to FIG. 7, a first blocking layer 72, a first upper insulating layer 73, and a second upper insulating layer 75 may be sequentially stacked on a first etch stop layer 71. A first upper interconnection 79 may be on the second upper insulating layer 75. A first upper plug 77B may be to pass through the first etch stop layer 71, the first blocking layer 72, the first upper insulating layer 73, and the second upper insulating layer 75. A third etch stop layer 91, a fifth upper insulating layer 93, and a sixth upper insulating layer 95 may be sequentially stacked on the second upper insulating layer 75 and the first upper interconnection 79.

A third upper plug 97A may be in the third etch stop layer 91, the fifth upper insulating layer 93, and the sixth upper insulating layer 95. The third upper plug 97A may pass through the third etch stop layer 91, the fifth upper insulating layer 93, and the sixth upper insulating layer 95 and be in contact with the second upper plug 87.

Figure 8:
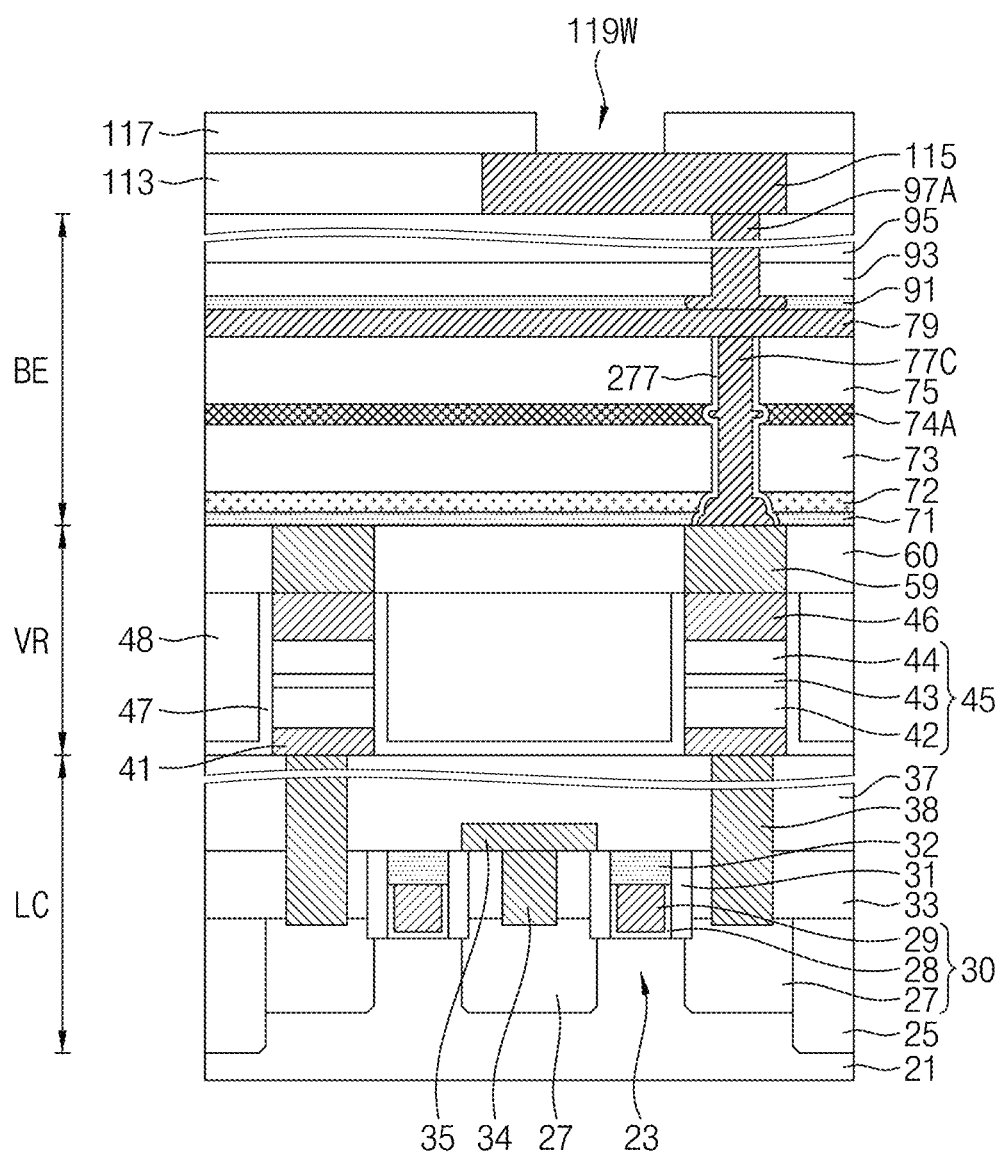

Referring to FIG. 8, a first blocking layer 72, a first upper insulating layer 73, a second blocking layer 74A, and a second upper insulating layer 75 may be sequentially stacked on a first etch stop layer 71. A first upper interconnection 79 may be on the second upper insulating layer 75. A first upper plug 77C may pass through the first etch stop layer 71, the first blocking layer 72, the first upper insulating layer 73, the second blocking layer 74A, and the second upper insulating layer 75. Contact spacers 277 may surround a side surface of the first upper plug 77.

The second blocking layer 74A may include a non-magnetic metal layer. The contact spacers 277 may be interposed between the first upper plug 77 and the second blocking layer 74A, between the first upper plug 77 and the first blocking layer 72, and between the first upper plug 77 and the first etch stop layer 71. The contact spacers 277 may include silicon oxide, silicon nitride, silicon oxynitride, a low-k dielectric, a high-k dielectric, or a combination thereof.

FIGS. 9 to 16 are cross-sectional views illustrating methods of forming a semiconductor device according to an example embodiment of the inventive concepts.

Figure 9:
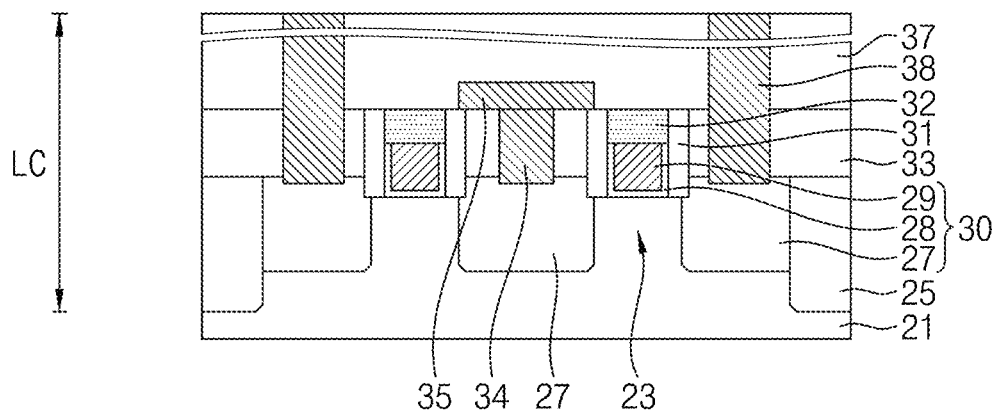
FIGS. 9 to 16 are cross-sectional views illustrating methods of forming a semiconductor device according to an example embodiment of the inventive concepts.

Referring to FIG. 9, an active region 23, a device isolation layer 25, a plurality of source/drain regions 27, a gate dielectric layer 28, a plurality of gate electrodes 29, a plurality of gate spacers 31, a plurality of gate capping layers 32, a first lower insulating layer 33, a source plug 34, a source line 35, a second lower insulating layer 37, and a plurality of lower plugs 38 may be formed in a logic circuit region LC on a substrate 21.

Figure 10:
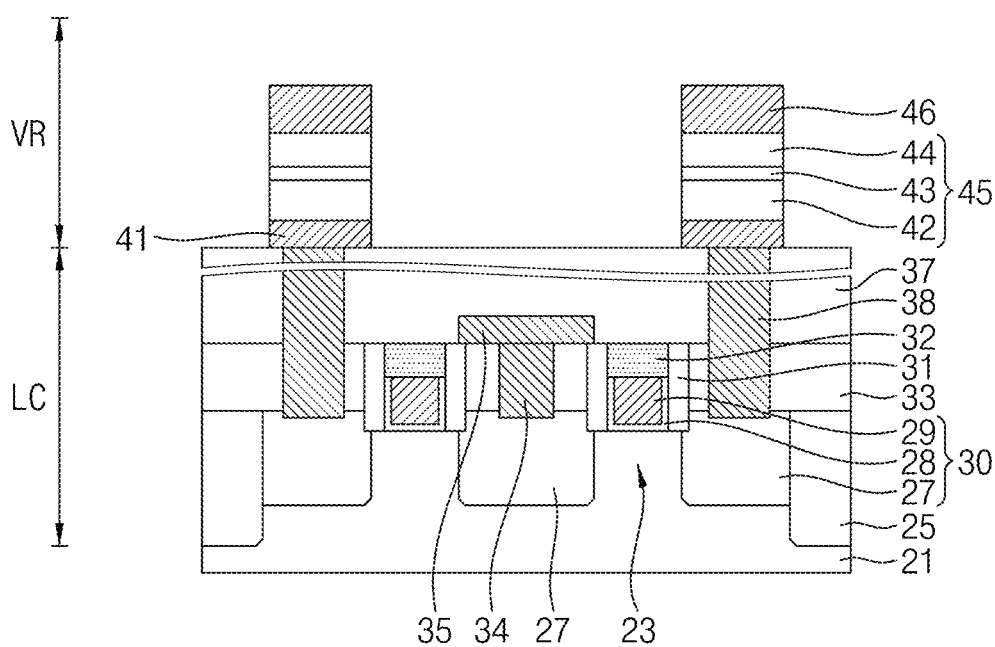

Referring to FIG. 10, a plurality of first lower electrodes 41, a plurality of first variable resistance elements 45, and a plurality of first upper electrodes 46 may be formed in a variable resistance region VR on the logic circuit region LC. Each of the plurality of first variable resistance elements 45 may include the first reference layer 42, the first tunnel layer 43, and the first storage layer 44 as discussed above.

Figure 11:
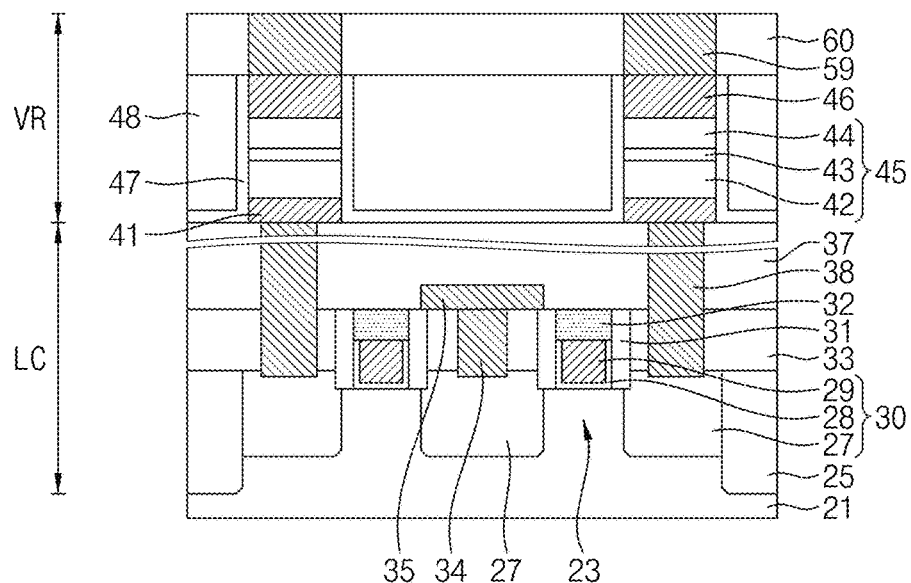

Referring to FIG. 11, first memory spacers 47 may be formed on side surfaces of the plurality of first lower electrodes 41, the plurality of first variable resistance elements 45, and the plurality of first upper electrodes 46. A first interlayer insulating layer 48 may be formed to cover the second lower insulating layer 37. Upper surfaces of the first interlayer insulating layer 48 and the plurality of first upper electrodes 46 may be substantially coplanar. A plurality of second middle interconnections 59 and a third interlayer insulating layer 60 may be formed on the first interlayer insulating layer 48. Each of the plurality of second middle interconnections 59 may be connected to a corresponding one of the plurality of first upper electrodes 46.

Figure 12:
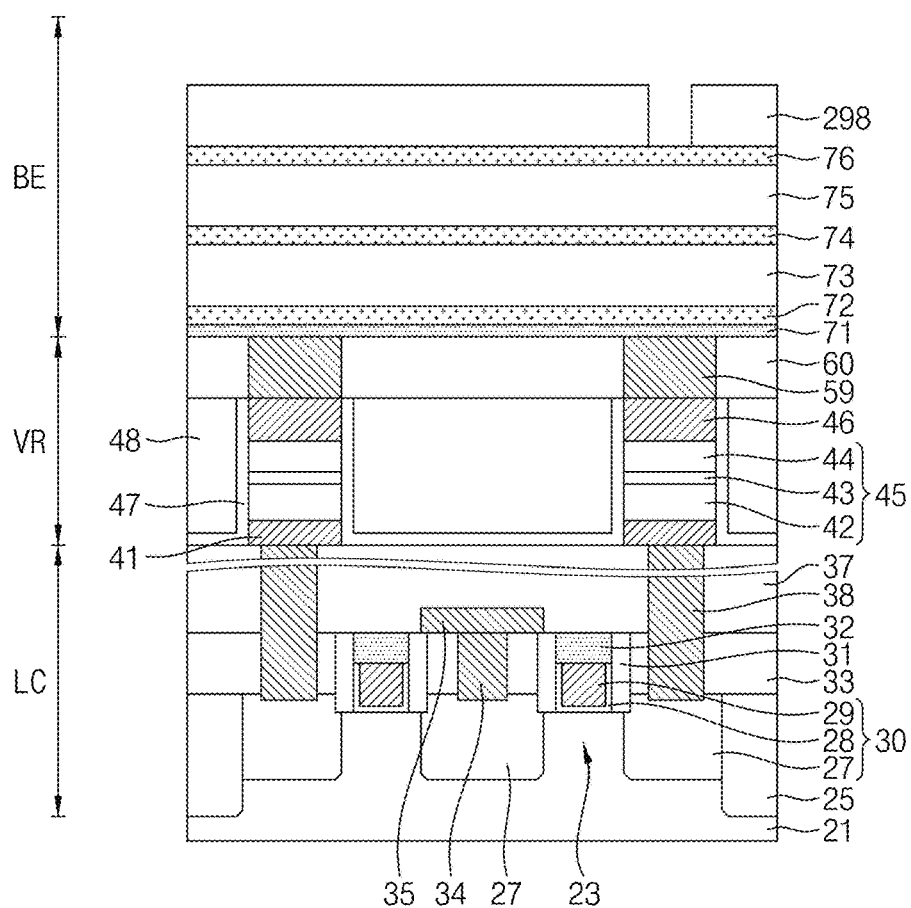

Referring to FIG. 12, a first etch stop layer 71, a first blocking layer 72, a first upper insulating layer 73, a second blocking layer 74, a second upper insulating layer 75, and a third blocking layer 76 may be sequentially stacked in an interconnection region BE on the variable resistance region VR. A mask pattern 298 may be formed on the third blocking layer 76.

Each of the first upper insulating layer 73 and the second upper insulating layer 75 may include silicon oxide, silicon nitride, silicon oxynitride, a low-k dielectric, or a combination thereof. In an embodiment, the first upper insulating layer 73 may include a silicon oxide layer formed using TEOS. The second upper insulating layer 75 may include a material layer that is relatively more flowable than the first upper insulating layer 73. The second upper insulating layer 75 may include a silicon oxide layer formed using FTEOS. The first and second upper insulating layer 73 and 75 may be formed, for example, by the decomposition of TEOS and FTEOS. The TEOS and FTEOS may be deposited on a first blocking layer 72 and a second blocking layer 74, respectively, via a chemical vapor deposition (CVD) process.

The first etch stop layer 71 may include a material having an etch selectivity with respect to the first upper insulating layer 73, the second upper insulating layer 75, the first blocking layer 72, the second blocking layer 74, and the third blocking layer 76. In an embodiment, the first etch stop layer 71 may include silicon carbonitride.

Each of the first blocking layer 72, the second blocking layer 74, and the third blocking layer 76 may include a material having a higher absorbance constant K than the first etch stop layer 71, the first upper insulating layer 73, and the second upper insulating layer 75. Each of the first blocking layer 72, the second blocking layer 74, and the third blocking layer 76 may include silicon oxynitride. Each of the first blocking layer 72, the second blocking layer 74, and the third blocking layer 76 may include a silicon oxynitride layer, which is formed using a low-temperature deposition process performed at a process temperature of 250° C. to 350° C. Each of the first blocking layer 72, the second blocking layer 74, and the third blocking layer 76 may be thicker than the first etch stop layer 71. Each of the first blocking layer 72, the second blocking layer 74, and the third blocking layer 76 may have a thickness of 10 nm to 100 nm.

Figure 13:
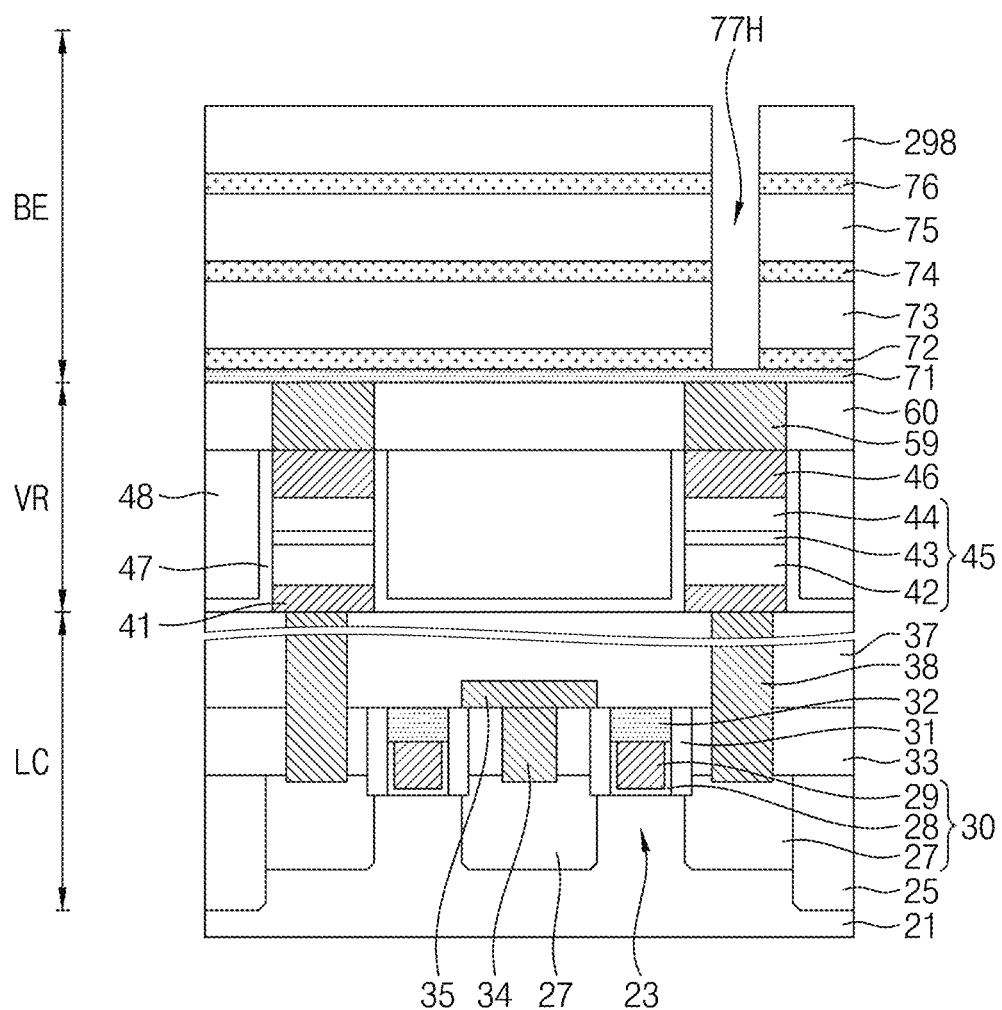

Referring to FIG. 13, a contact hole 77H may be formed using the mask pattern 298 as an etch mask to pass through the third blocking layer 76, the second upper insulating layer 75, the second blocking layer 74, the first upper insulating layer 73, and the first blocking layer 72. The first etch stop layer 71 may be exposed at a bottom of the contact hole 77H.

Figure 14:
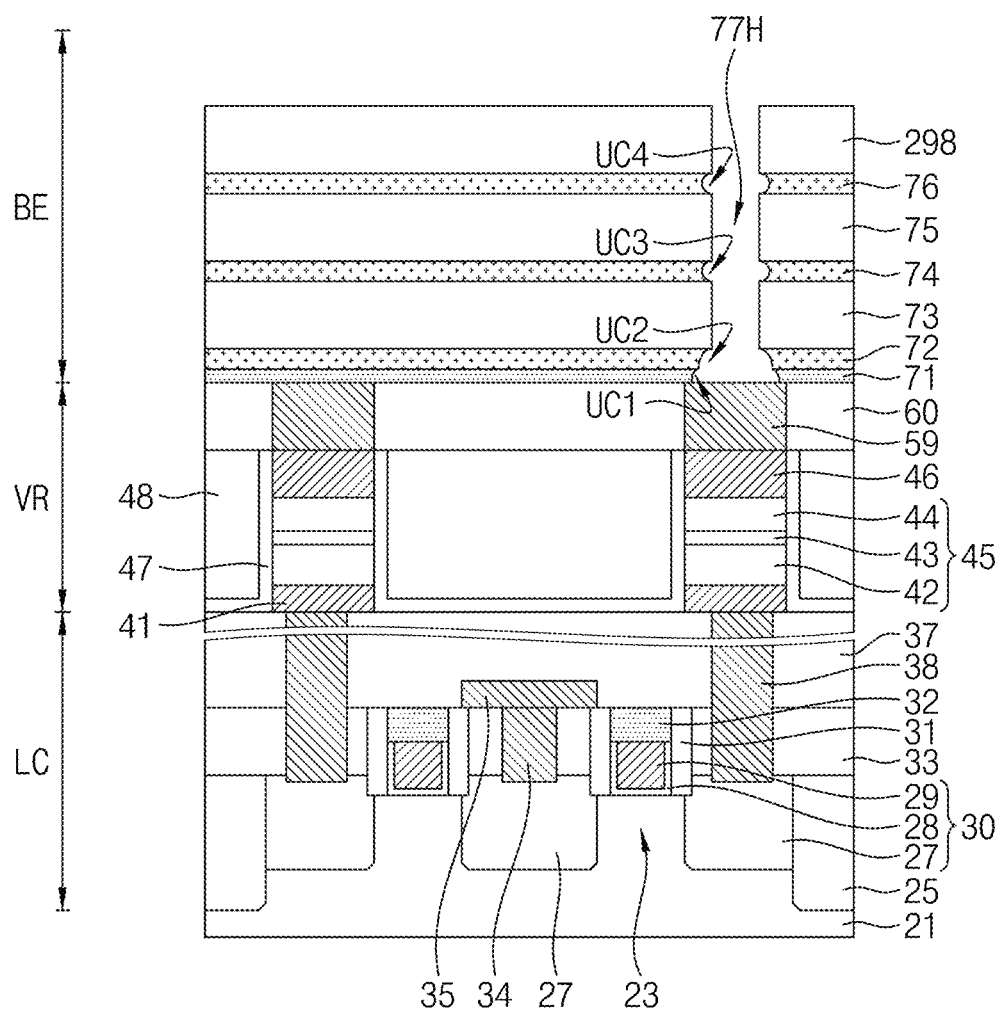

Referring to FIG. 14, the contact hole 77H may be expanded by etching the first etch stop layer 71. The plurality of second middle interconnections 59 may be exposed at the bottom of the contact hole 77H. First to fourth undercut regions UC1, UC2, UC3, and UC4 may be formed during the etching of the first etch stop layer 71. The first undercut region UC1 may be formed adjacent to the first etch stop layer 71. The second undercut region UC2 may be formed adjacent to the first blocking layer 72. The third undercut region UC3 may be formed adjacent to the second blocking layer 74. The fourth undercut region UC4 may be formed adjacent to the third blocking layer 76. The mask pattern 298 may be removed, exposing the upper surface of the third blocking layer 76. The mask pattern 298 may be, for example, removed as a result of the etching of the first etch stop layer 71 or after the etching in an separate process.

Figure 15:
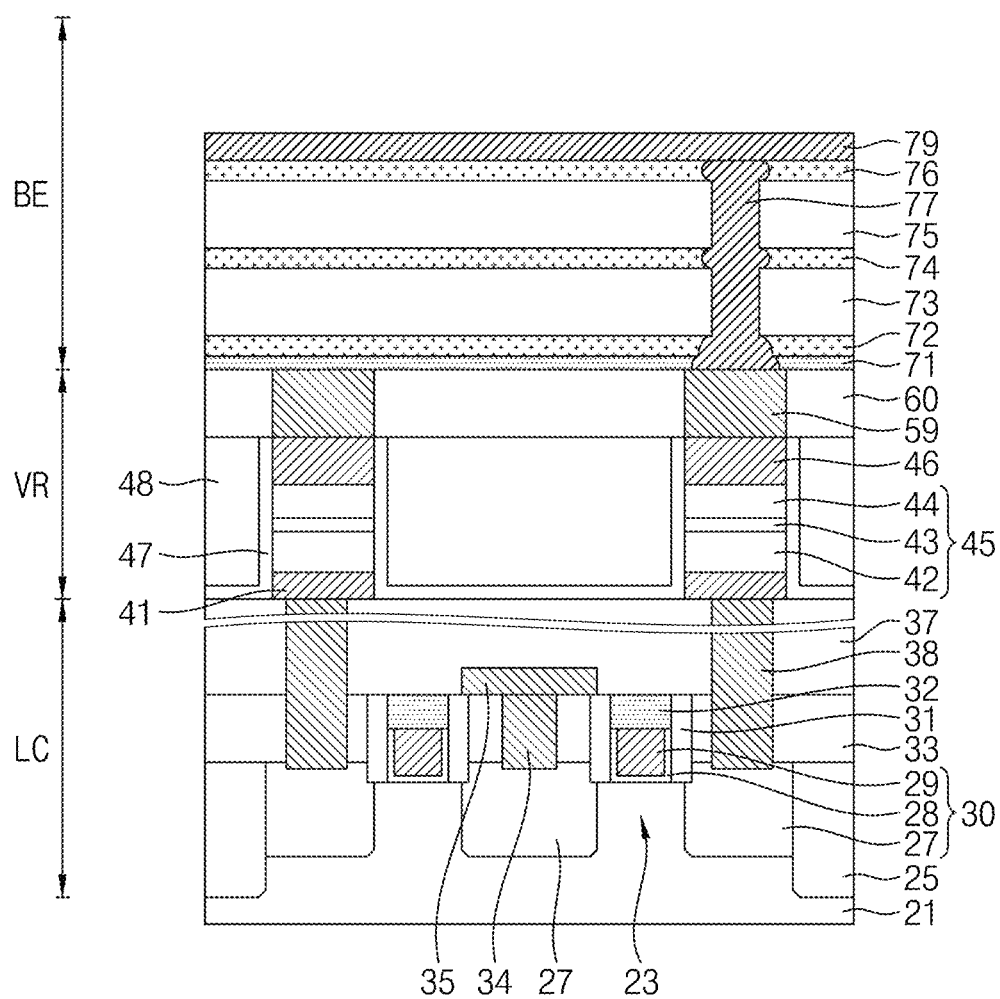

Referring to FIG. 15, a first upper plug 77 may be formed inside the contact hole 77H. A first upper interconnection 79 may be formed on the third blocking layer 76 and in contact with the first upper plug 77.

The formation of the first upper plug 77 and the first upper interconnection 79 may include a plurality of patterning process. The plurality of patterning processes may include an etching process using plasma. The first blocking layer 72, the second blocking layer 74, and the third blocking layer 76 may prevent or reduce the damage to the plurality of first variable resistance elements 45 during the plurality of patterning processes.

Figure 16:
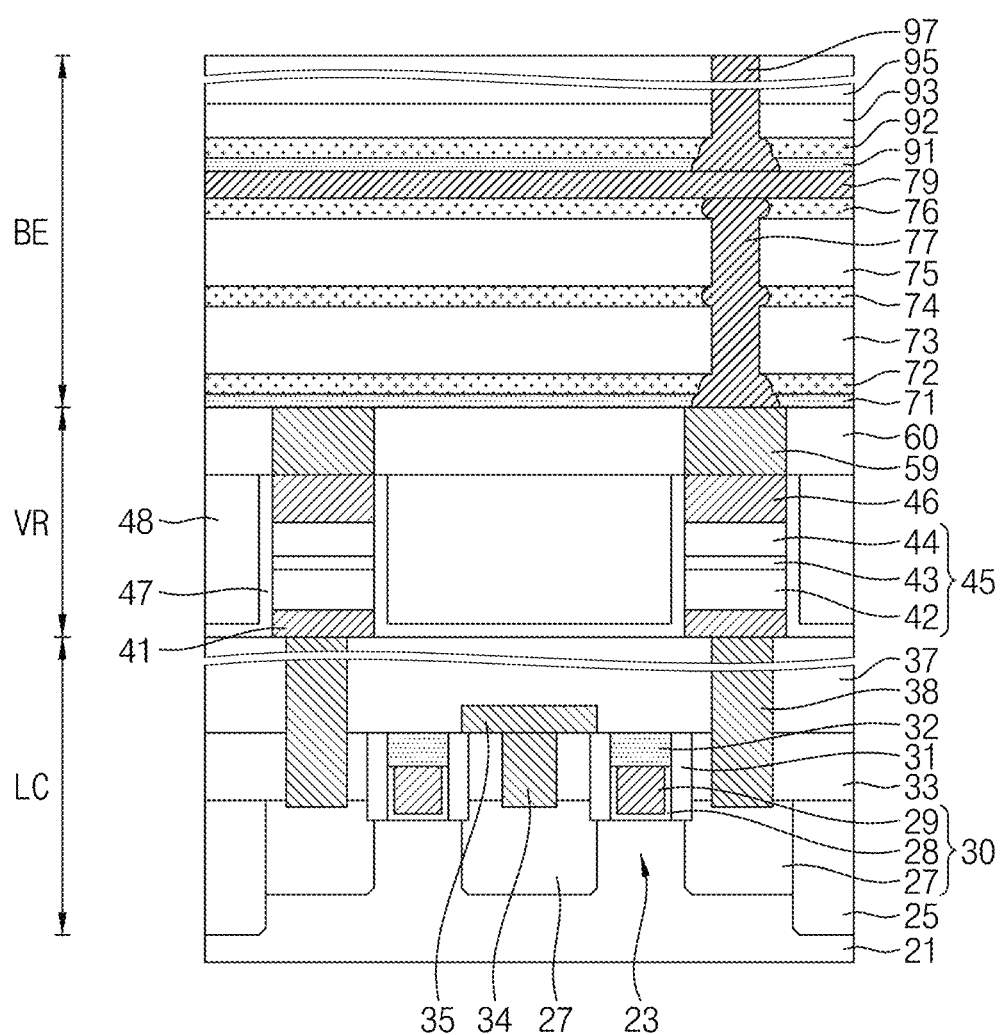

Referring to FIG. 16, a third etch stop layer 91, a fifth blocking layer 92, a fifth upper insulating layer 93, and a sixth upper insulating layer 95 may be sequentially stacked on the third blocking layer 76 and the first upper interconnection 79. A third upper plug 97 may be formed to pass through the sixth upper insulating layer 95, the fifth upper insulating layer 93, the fifth blocking layer 92, and the third etch stop layer 91 and be in contact with the first upper interconnection 79.

The formation of the third upper plug 97 may include a patterning process. The patterning process may include an etching process using plasma. The first blocking layer 72, the second blocking layer 74, the third blocking layer 76, and the fifth blocking layer 92 may prevent damage to the plurality of first variable resistance elements 45 during the patterning process.

According to the example embodiments of the inventive concepts, a semiconductor device including a plurality of variable resistance elements, at least one blocking layer, an upper insulating layer, a plurality of upper plugs, and a plurality of upper interconnections can be provided. The at least one blocking layer can include a material having a higher absorbance constant K than the upper insulating layer. The at least one blocking layer can prevent damage to the plurality of variable resistance elements during a process of forming the plurality of upper plugs and the plurality of upper interconnections. A semiconductor device can be implemented that is advantageous for increasing mass productivity efficiency and having excellent electrical properties.

While the embodiments of the inventive concepts have been described with reference to the accompanying drawings, it should be understood by those skilled in the art that various modifications may be made without departing from the scope of the inventive concepts and without changing essential features thereof. Therefore, the above-described embodiments should be considered in a descriptive sense only and not for purposes of limitation.

What is claimed is:

1. A semiconductor device comprising:
   a plurality of magnetic tunnel junction (MTJ) structures in an interlayer insulating layer on a substrate;
   a blocking layer on the interlayer insulating layer and the plurality of MTJ structures;
   an upper interconnection including a conductive material;
   an upper insulating layer between the blocking layer and the upper interconnection, the blocking layer comprising a material having a higher absorbance constant than the upper insulating layer; and
   an upper plug extending into the upper insulating layer and the blocking layer such that the upper plug electrically connects the upper interconnection to an MTJ structure of the plurality of MTJ structures.

2. The semiconductor device of claim 1, wherein the blocking layer comprises silicon oxynitride.

3. The semiconductor device of claim 1, wherein the blocking layer has a thickness of 10 nm to 100 nm.

4. The semiconductor device of claim 1, wherein each of the plurality of MTJ structures comprises:
   a reference layer;
   a storage layer on the reference layer; and
   a tunnel layer between the reference layer and the storage layer.

5. The semiconductor device of claim 4, further comprising memory spacers on side surfaces of each of the plurality of MTJ structures.

6. The semiconductor device of claim 5, wherein the memory spacers comprise a material having a higher absorbance constant than the upper insulating layer.

7. The semiconductor device of claim 1, further comprising
   an etch stop layer between the interlayer insulating layer and the blocking layer.

8. The semiconductor device of claim 7, wherein the absorbance constant of the material of the blocking layer is higher than an absorbance constant of the etch stop layer.

9. The semiconductor device of claim 8, wherein the blocking layer is thicker than the etch stop layer.

10. The semiconductor device of claim 8, wherein the etch stop layer comprises silicon carbonitride, and the blocking layer comprises silicon oxynitride.

11. A semiconductor device comprising:
    a logic circuit region on a substrate;
    a variable resistance region on the logic circuit region, the variable resistance region comprising a plurality of variable resistance elements in an interlayer insulating layer;
    an interconnection region on the variable resistance region, the interconnection region comprising a first upper insulating layer on a first blocking layer and the first blocking layer on a first etch stop layer, the first blocking layer comprising a material having a higher absorbance constant than the first upper insulating layer and the first etch stop layer;
    a first upper interconnection on the first upper insulating layer; and
    a first upper plug connected to the first upper interconnection and a corresponding one of the plurality of variable resistance elements and extending into the first upper insulating layer, the first blocking layer, and the first etch stop layer.

12. The semiconductor device of claim 11, wherein the plurality of variable resistance elements comprise magnetoresistive random access memory (MRAM), resistive RAM (RRAM), ferroelectric RAM (FeRAM), or a combination thereof.

13. The semiconductor device of claim 11, wherein the logic circuit region comprises a plurality of transistors connected to the plurality of variable resistance elements.

14. The semiconductor device of claim 11, further comprising:
    a second blocking layer between the first upper insulating layer and the first upper interconnection,
    wherein the second blocking layer comprises a material having a higher absorbance constant than the first upper insulating layer and the first etch stop layer.

15. The semiconductor device of claim 14, further comprising:
    a second upper insulating layer between the first upper insulating layer and the first upper interconnection; and
    a third blocking layer between the second upper insulating layer and the first upper interconnection,
    wherein the third blocking layer comprises a material having a higher absorbance constant than the second upper insulating layer, the first upper insulating layer, and the first etch stop layer.

16. The semiconductor device of claim 11, further comprising:
    a second upper insulating layer between the first upper insulating layer and the first upper interconnection;

a second etch stop layer on the first upper interconnection;
a fourth blocking layer on the second etch stop layer;
a third upper insulating layer on the fourth blocking layer;
a second upper interconnection on the third upper insulating layer; and
a second upper plug connected to the first upper interconnection and the second upper interconnection and extending into the second upper insulating layer, the fourth blocking layer, and the second etch stop layer,
wherein the fourth blocking layer comprises a material having a higher absorbance constant than the third upper insulating layer and the second etch stop layer.

17. The semiconductor device of claim 11, further comprising:
an input/output (I/O) terminal on the interconnection region,
wherein the I/O terminal comprises a bump pad, a bonding pad, or a bond finger.

18. A semiconductor device comprising:
a plurality of magnetic tunnel junction (MTJ) structures in an interlayer insulating layer on a substrate;
an etch stop layer on the interlayer insulating layer and the plurality of MTJ structures;
at least one blocking layer on the etch stop layer, the at least one blocking layer comprising a non-magnetic metal layer;
a first upper insulating layer on the at least one blocking layer;
an upper interconnection on the first upper insulating layer; and
an upper plug connected to the upper interconnection and a corresponding one of the plurality of MTJ structures and extending into the first upper insulating layer, the at least one blocking layer, and the etch stop layer.

19. The semiconductor device of claim 18, further comprising contact spacers between the at least one blocking layer and the upper plug.

20. The semiconductor device of claim 18, further comprising:
a second upper insulating layer between the etch stop layer and the first upper insulating layer,
wherein the at least one blocking layer comprises a first blocking layer between the etch stop layer and the second upper insulating layer; and a second blocking layer between the second upper insulating layer and the first upper insulating layer, and
wherein the first blocking layer comprises a material having a higher absorbance constant than the second upper insulating layer, and the second blocking layer comprises the non-magnetic metal layer.

* * * * *